US010389110B2

(12) United States Patent
Asanza Maldonado

(10) Patent No.: US 10,389,110 B2
(45) Date of Patent: Aug. 20, 2019

(54) ELECTRONIC CIRCUIT BREAKER

(71) Applicant: Ellenberger & Poensgen GmbH, Altdorf (DE)

(72) Inventor: Diego Fernando Asanza Maldonado, Nuremberg (DE)

(73) Assignee: ELLENBERGER & POENSGEN GMBH, Altdorf (DE)

( * ) Notice: Subject to any disclaimer, the term of this patent is extended or adjusted under 35 U.S.C. 154(b) by 95 days.

(21) Appl. No.: 15/445,175

(22) Filed: Feb. 28, 2017

(65) Prior Publication Data

US 2017/0170654 A1     Jun. 15, 2017

Related U.S. Application Data

(63) Continuation of application No. PCT/EP2015/069693, filed on Aug. 27, 2015.

(30) Foreign Application Priority Data

Aug. 28, 2014    (DE) .................. 10 2014 012 828

(51) Int. Cl.
| | | |
|---|---|---|
| *H02H 9/08* | (2006.01) | |
| *H02H 9/02* | (2006.01) | |
| *H02H 9/00* | (2006.01) | |
| *H03K 17/082* | (2006.01) | |
| *H03K 17/081* | (2006.01) | |

(52) U.S. Cl.
CPC ............ *H02H 9/025* (2013.01); *H02H 9/001* (2013.01); *H03K 17/0822* (2013.01); *H03K 17/08104* (2013.01)

(58) Field of Classification Search
None
See application file for complete search history.

(56) References Cited

U.S. PATENT DOCUMENTS

| | | |
|---|---|---|
| 5,041,940 A | 8/1991 | Sullivan |
| 6,356,423 B1 | 3/2002 | Hastings et al. |
| 6,490,141 B2 | 12/2002 | Fischer et al. |
| 6,839,254 B2 | 1/2005 | Rampold et al. |
| 7,230,813 B1 | 6/2007 | Canova et al. |
| 8,320,090 B2 | 11/2012 | Rozman et al. |

(Continued)

FOREIGN PATENT DOCUMENTS

| | | |
|---|---|---|
| AU | 2013 205 395 B1 | 1/2014 |
| DE | 200 10 283 U1 | 8/2001 |

(Continued)

*Primary Examiner* — Ronald W Leja
(74) *Attorney, Agent, or Firm* — Muncy, Geissler, Olds & Lowe, P.C.

(57) ABSTRACT

An electronic circuit breaker with a semiconductor switch, a drain connection and a source connection of the semiconductor switch being connected between a voltage input and a load output, and a gate connection of said semiconductor switch being connected to a control device which is supplied, at the input end, with a signal which represents the load current. The control device determines the drain-source voltage and, from this and from the detected load current, generates a control signal which is routed to the gate connection of the semiconductor switch and by means of which the power of the semiconductor switch is adjusted to less than or equal to a maximum power value.

10 Claims, 2 Drawing Sheets

(56) References Cited

U.S. PATENT DOCUMENTS

| | | | |
|---|---|---|---|
| 8,941,963 B2 | 1/2015 | Souma | |
| 9,537,303 B2 | 1/2017 | Tanaka et al. | |
| 2001/0010458 A1* | 8/2001 | Ohshima | H03K 17/0822 323/282 |
| 2007/0132502 A1 | 6/2007 | Kollner et al. | |
| 2010/0327828 A1 | 12/2010 | Lee et al. | |
| 2011/0234185 A1* | 9/2011 | Nagase | H03K 17/0822 323/277 |
| 2011/0242716 A1* | 10/2011 | Ueta | H02H 3/087 361/79 |
| 2011/0299201 A1 | 12/2011 | Rozman et al. | |
| 2012/0293017 A1 | 11/2012 | Lidsky et al. | |
| 2013/0147523 A1 | 6/2013 | Deboy et al. | |
| 2013/0332750 A1 | 12/2013 | Souma | |
| 2015/0085416 A1* | 3/2015 | Chu | H02H 9/025 361/93.9 |
| 2015/0123629 A1* | 5/2015 | Ohshima | H03K 17/0822 323/271 |
| 2015/0138680 A1 | 5/2015 | Souma | |
| 2015/0280425 A1* | 10/2015 | Kreuter | H02H 9/02 361/93.1 |
| 2017/0170654 A1* | 6/2017 | Asanza Maldonado | |

FOREIGN PATENT DOCUMENTS

| | | |
|---|---|---|
| DE | 203 02 275 U1 | 6/2003 |
| DE | 10 2005 038 124 A1 | 2/2007 |
| EP | 1 150 410 A2 | 10/2001 |
| EP | 2 403 088 A2 | 1/2002 |
| EP | 1 186 086 B1 | 12/2002 |
| EP | 1 294 069 B1 | 4/2006 |
| EP | 2 750 293 A1 | 7/2014 |
| JP | 2013255117 A | 12/2013 |
| WO | WO 2012/148774 A2 | 11/2012 |

\* cited by examiner

ELECTRONIC CIRCUIT BREAKER

This nonprovisional application is a continuation of International Application No. PCT/EP2015/069693, which was filed on Aug. 27, 2015, and which claims priority to German Patent Application No. 10 2014 012 828.8, which was filed in Germany on Aug. 28, 2014, and which are both herein incorporated by reference.

BACKGROUND OF THE INVENTION

Field of the Invention

The invention relates to an electronic circuit breaker with a semiconductor switch, the source connection and drain connection of which are connected between a voltage input and a load output, and the gate connection of which is connected to a control unit, which is supplied at the input end with a signal representing the load current.

Description of the Background Art

An electronic switch or circuit breaker of this type is known, for example, from DE 203 02 275U1. The electronic switch has a semiconductor switch in the form of a MOSFET (metal-oxide-semiconductor field-effect transistor), which is connected in a current path between an operating voltage connection and a load connection. To achieve reliable current limitation in a direct voltage network, a measured value, detected by a current sensor in the current path, is supplied to a comparator input of a control device. When a switch-on signal is present and at a measured value that falls below a reference value, the control device biases the semiconductor switch into conduction, whereas at a measured value that exceeds the reference value, the control device biases the power transistor to cut-off and limits the current flowing across it to the reference value.

A power distribution system in the low-voltage range, in particular, in the 24 V DC range, having a number of circuits each having an electronic circuit breaker as short-circuit protection and/or overload protection, is known from EP 1 186 086 B1, which corresponds to U.S. Pat. No. 6,490,141, which is incorporated herein by reference. The circuits are jointly supplied by a clocked power supply unit. In the event of an overload when an adjustable threshold is exceeded, e.g., by 1.1 times the rated current ($I_N$), the electronic circuit breaker is switched off after the delay time has expired, whereas in the event of a short circuit, a current limitation occurs first and after a further threshold (e.g., $2 \times I_N$) is exceeded, the circuit breaker is switched off after a specific turn-off time has expired.

An electronic circuit breaker, which is triggered by a microprocessor via a trip circuit and interrupts the power supply to a load with a time delay, is known from EP 1 150 410 A2, which corresponds to U.S. Pat. No. 6,356,423. A partial interruption of the circuit breaker occurs beforehand or simultaneously.

A partial interruption of an electronic circuit breaker with a plurality of switch blocks, each of which have an electronic switch in the form of a MOSFET and a comparator controlling it via a joint microprocessor, is also known from EP 1 294 069 B1, which corresponds to U.S. Pat. No. 7,230,813. In the case of an overcurrent, the power supply to the load is interrupted after a time delay, which follows a partial inhibition of the at least one switch.

The semiconductor switch of the electronic circuit breaker is utilized as a constant current source for charging the capacitor for switching particularly capacitive loads and/or for the protection thereof from overcurrent and short circuit. The semiconductor switch and in particular a MOSFET employed hereby must be able to support the power dissipation as a result of the inrush current during the switching or during the charging of the capacitor. Because of this situation, electronic circuit breakers, in particular those with a constant current limitation, are usually designed with an overdimensioned semiconductor switch (MOSFET) to adequately take into account this power dissipation. A dimensioning of this type of employed semiconductor switch leads to increased expenditures, however, and a correspondingly large space requirement within the circuit of the electronic circuit breaker.

An alternative option is to undertake a clocked driving of the semiconductor switch by means of pulse width modulation (PWM). However, this increases not only the driving outlay. Rather, PWM driving leads to problems in the case of inductive loads.

SUMMARY OF THE INVENTION

It is therefore an object of the invention to provide an electronic circuit breaker operating as effectively as possible while avoiding the named disadvantages. In particular, an overdimensioned semiconductor switch and its costly driving should be avoided in this case.

Furthermore, a suitable method for operating such an electronic circuit breaker is to be provided. An operating method of this type is to be understood in particular as a suitable driving method for controlling and/or regulating the semiconductor switch of such an electronic circuit breaker, in particular during a switch-on process for a load.

In an exemplary embodiment, it is provided that a control or regulating device, which is connected to the gate connection of a semiconductor switch, connected between a voltage input and a load output, determines the drain-source voltage of the semiconductor switch, and generates a gate signal for the semiconductor switch from said voltage and from the detected load or semiconductor current (drain-source current), and on the basis of the signal the power of the semiconductor switch is adjusted to be less than or equal to a maximum power value.

The invention is based in this regard on the premise that during the charging process of a capacitive load a dynamic current limitation is utilized, which in contrast to a constant current limitation is not set to a specific threshold value but depends on the actual value of the drain-source voltage of the semiconductor switch (MOSFET) and changes dynamically with the proviso that the relationship between the current actually flowing across the semiconductor switch (drain-source current) and the drain-source voltage is always kept within a safe operating range of the semiconductor switch. The current control in this case can occur via analog or with the use of a microprocessor.

Because due to this active current control, the power dissipation of the semiconductor switch can be controlled in a regulated manner, the semiconductor switch accordingly can be dimensioned smaller with respect to the predominant power dissipation. Because in addition this type of power control of the semiconductor switch is virtually independent of the gate signal waveform, inductive loads can also be reliably switched and protected.

The drain-source voltage of the semiconductor switch can be determined either directly or derived from available voltage values. Therefore, the drain voltage of the semiconductor switch or the input voltage of the electronic circuit breaker and the source voltage of the semiconductor switch or the output-side load voltage of the electronic circuit breaker are advantageously detected and supplied as the respective voltage value to the control unit. The unit determines the drain-source voltage of the semiconductor switch therefrom, in particular by difference formation.

The measured current value used for power adjustment of the semiconductor switch, in particular during a switch-on process of the electronic circuit breaker, due to the series connection of the semiconductor switch with the load, corresponds to the load current flowing across it, which is detected by a current sensor in the current path of the semiconductor switch and the load. The power adjustment of the semiconductor switch then occurs by the formation of the product of the detected or determined drain-source voltage and the load current. In this case, the semiconductor switch is triggered via its gate connection such that its power is less than or equal to a specific, maximum power value, for example, 50 W.

Advantageously, the electronic circuit breaker is designed in addition with a constant current limitation so as to limit the current flowing across the load in the event of an overload and/or short circuit to a specific, predetermined current threshold value.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
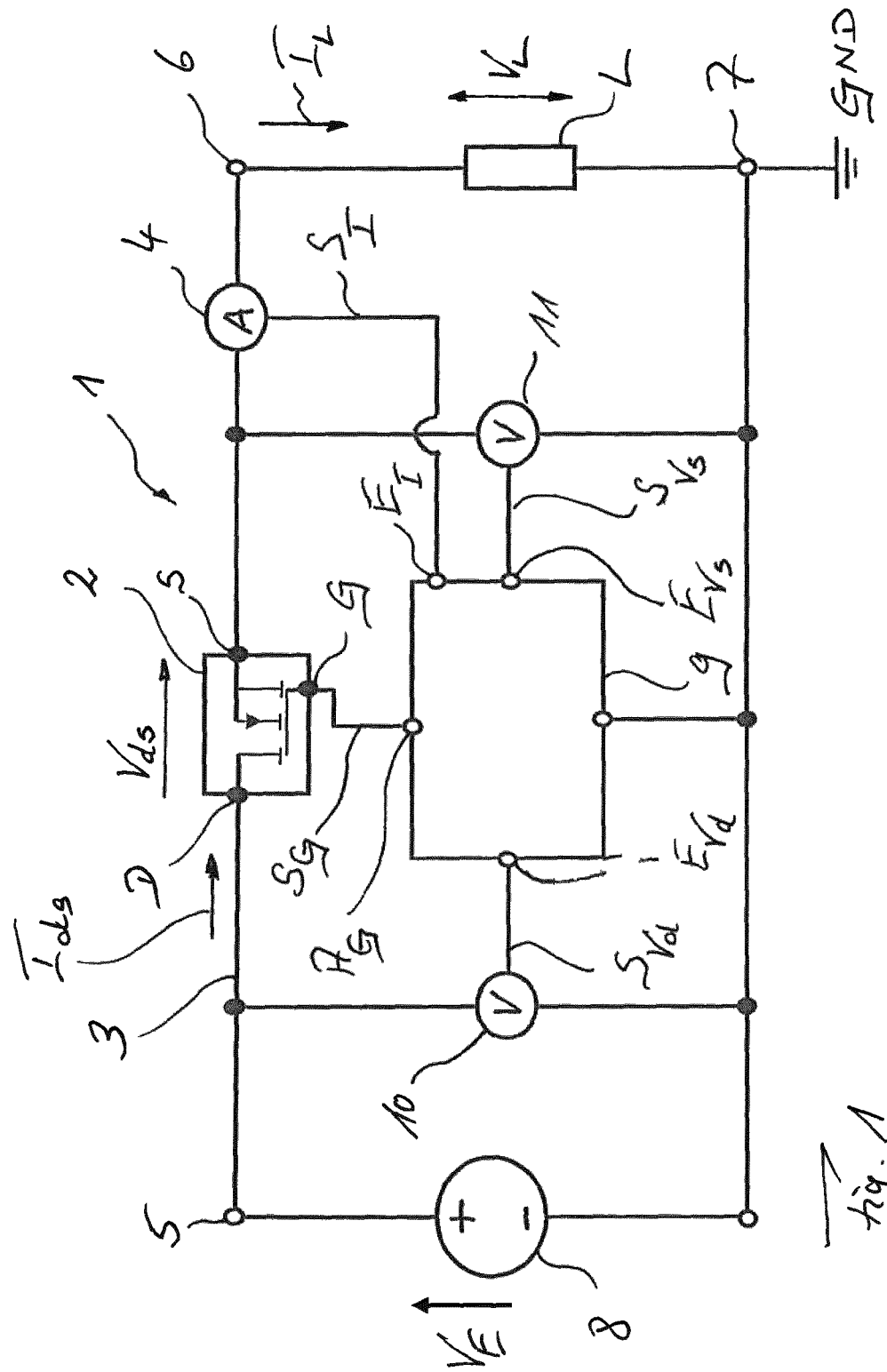
FIG. 1 is a block diagram that shows an electronic circuit breaker with a controlled semiconductor switch in the positive path of a current control and with a control unit, set up and provided for its power control, in the form of, for example, a microprocessor.

The schematically illustrated electronic circuit breaker 1 comprises a power transistor or semiconductor switch 2 in the form of a MOSFET, downstream of which a current sensor 4 is connected in a current path 3, namely, the positive path of circuit breaker 1. Current path 3 extends between an operating voltage connection or voltage input 5 and a positive load connection 6. The positive pole of a load L to be switched is connected to said load connection, whereas the negative pole of the load is to be connected to a corresponding negative load connection 7 of circuit breaker 1. Said connection 7 in the exemplary embodiment is taken to ground GND. The operating or input voltage $V_E$ generated by a current or voltage source of a power supply unit 8 in the form of, for example, a direct voltage with 24 V (DC) is applied at voltage input 5 of electronic circuit breaker 1.

In the case of connected voltage source 8 and connected load L, during operation of circuit breaker 1 a load current $I_L$ drains to a reference potential or to ground GND proceeding from voltage input 5 over current path 3 and therefore over the drain-source path of semiconductor switch 2 and across load L. This load current $I_L$ flowing across semiconductor switch 2 and load L is detected by current sensor 4. The detected current $I_L$, which because of the series connection of semiconductor switch 2 and load L corresponds to the drain-source current $I_{ds}$ flowing across semiconductor switch 2, is routed as current signal $S_I$ to a first input $E_I$ of a control unit 9.

Based on this current measurement, the semiconductor switch can be triggered within the scope of a constant current limitation by the control unit such that in the event of an overload or short circuit load, current $I_L$ is limited at least briefly to a predetermined maximum current value. This is, for example, 1.1 times the rated current $I_N$ in the event of an overload. In the event of a short circuit, this maximum current value can be, for example, twice the rated current $I_N$. When there is only one threshold value for the case of the overload and short circuit, the maximum current value can be, for example, 1.5 times the rated current $I_N$.

A first voltage signal $S_{Vd}$ is supplied in addition to control unit 9 via a second input $E_{Vd}$. This voltage, detected by a first voltage sensor 10, in the exemplary embodiment corresponds both to the input or operating voltage $V_E$ and to the drain voltage $V_d$ of semiconductor switch 2 at its drain connection D.

A second voltage signal $S_{Vs}$, is supplied in addition to control unit 9. In the exemplary embodiment, this refers to both the source voltage $V_s$ at source connection S of semiconductor switch 2 and to load voltage $V_L$. Voltage signal $V_s$, detected in turn by a corresponding second voltage sensor 11, is routed to a third input $E_{Vs}$ of control unit 9.

From the detected voltage values $V_d$ and $V_s$ from the detected drain-source current $I_{ds}$, which corresponds to load current $I_L$ detected by current sensor 4, control unit 9 determines the current power $P_{FET}$ of semiconductor switch 2 according to the relation $P_{FET}=(V_d-V_s) \cdot I_{ds}$ and adjusts it by dynamic current limitation of the load and semiconductor current $I_L(=I_{ds})$ by the appropriate limitation of said current $I_{ds}$ in such a way that the power $P_{FET}$ does not exceed a specific, maximum power value $P_{max}$. This power value is, for example, $P_{max}=50$ W, which is achieved if necessary by the appropriate dynamic triggering of semiconductor switch 2 but is not exceeded. To this end, control unit 9 generates an appropriate control signal $S_G$, which can be tapped at an output $A_G$ of control unit 9 and is routed to gate connection G of semiconductor switch 2.

A relatively low-power semiconductor switch 2 can be used, based on this dynamic current limitation, current control, or current regulation of semiconductor switch 2 by control unit 9, by detecting and evaluating drain-source voltage $V_{ds}$ of semiconductor switch 2 and the current $I_{ds}$ flowing across it and as a result of the corresponding power limitation of semiconductor switch 2 to a power value $P_{FET}$ that is less than or equal to $P_{max}$.

Whereas in the prior art to implement a 10 A circuit breaker ($I_N=10$ A) with a normal power dissipation of less than 5 W, it would have to be equipped with a 300 W MOSFET due to the switch-on effects in the case of capacitive loads, a substantially smaller dimensioned MOSFET can be used as semiconductor switch 2 by means of the power control of the invention by dynamic current limitation.

Figure 2:
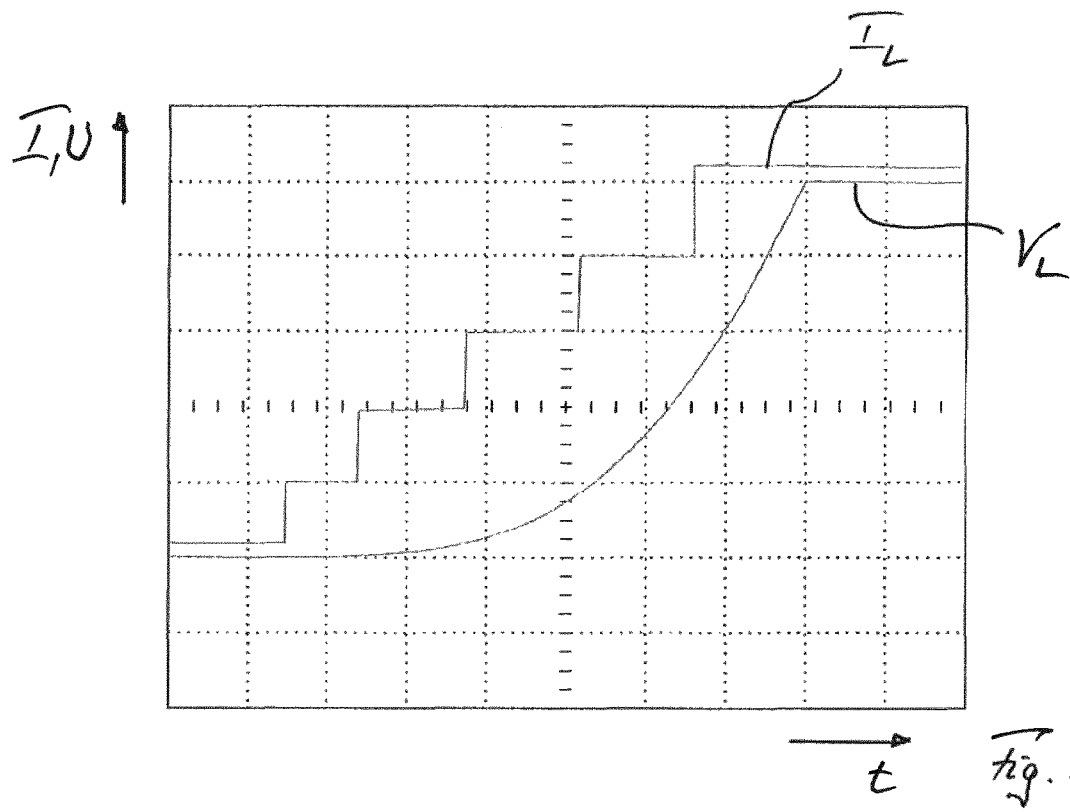
FIG. 2 is a current/voltage time diagram that shows the load current and load voltage profile as a result of the power control of the semiconductor switch during a switch-on process of a particularly capacitive load in the case of a stepped or step-like increase in the current.
Figure 3:
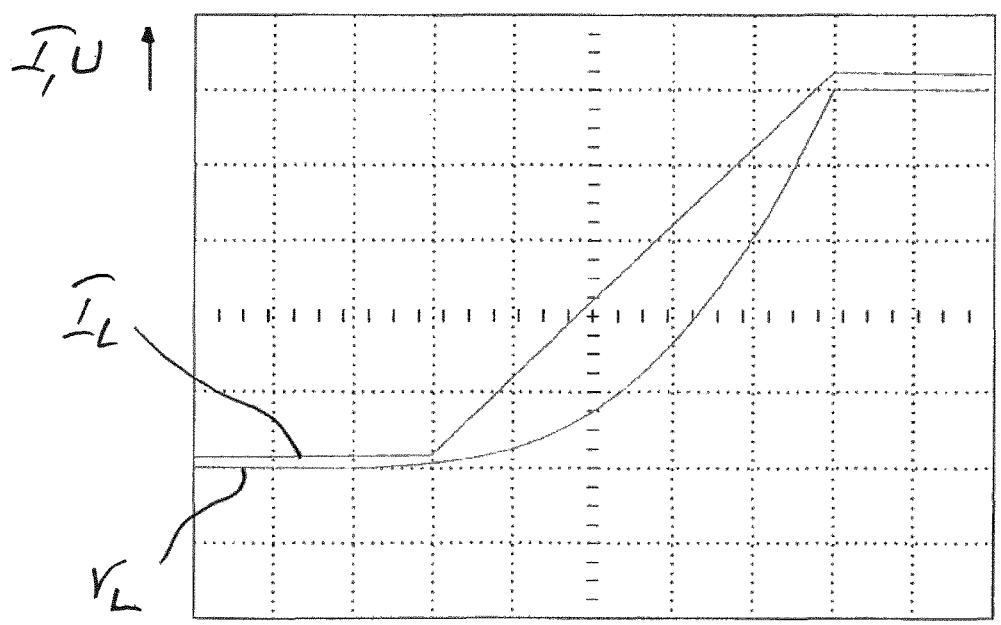
FIG. 3 is a diagram according to FIG. 2 that shows the current and voltage profile in the case of a ramp-like increase in the current.

FIG. 2 in a current/voltage-time diagram shows the profile of load current $I_L$ and load voltage $V_L$ as a result of the power control of semiconductor switch 2 during a switch-on process of a capacitive load L as a result of the correspondingly adjusted gate signal $S_G$ of semiconductor switch 2 in the case of a stepped or step-shaped increase in load current $I_L$. FIG. 3 shows the situation in the case of a ramp-shaped increase in current.

The invention is not limited to the exemplary embodiments described above. Rather, other variants of the invention can also be derived herefrom by the skilled artisan, without going beyond the subject of the invention. Particularly, further all individual features described in relation to the exemplary embodiments can also be combined with one another in a different manner, without going beyond the subject of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for operating an electronic circuit breaker, the method comprising:
   connecting a semiconductor switch between a voltage input and a load output;
   supplying, on a triggering side of the semiconductor switch, a control signal that is derived from a current and from a drain-source voltage; and
   adjusting a power of the semiconductor switch during a switch-on process of a load to less than or equal to a maximum power value,
   wherein as a result of the adjustment of the power of the semiconductor switch during the switch-on process of the load due to adjusting of the control signal, a load current rises in a stepped-shaped increase or in a gradual or ramp-shaped increase.

2. The method according to claim 1, wherein the drain-source voltage of the semiconductor switch is determined from a drain or input voltage and from a source or load voltage.

3. The method according to claim 1, wherein the semiconductor switch is triggered such that in an event of an overload and/or short circuit, the load current is limited to a threshold value.

4. The method according to claim 1, further comprising connecting an input end of a control unit to a first voltmeter to detect an input voltage and/or a drain voltage of the semiconductor switch, and connecting the input end of the control unit to a second voltmeter to detect a load voltage and/or a source voltage of the semiconductor switch, the first voltmeter being connected between the voltage input and a drain connection of the semiconductor switch and the second voltmeter being connected between a source connection of the semiconductor switch and the load output.

5. An electronic circuit breaker comprising:
   a control unit; and
   a semiconductor switch having a drain connection and a source connection that are connected between a voltage input and a load output, and having a gate connection connected to the control unit to which at an input end, a signal representing the load current is supplied,
   wherein the control unit controls the semiconductor switch as a function of a drain-source voltage and the detected load current,
   wherein the control unit routes a control signal to adjust a power of the semiconductor switch during a switch-on process of a load to less than or equal to a maximum power value to the gate connection of the semiconductor switch, and
   wherein as a result of the adjustment of the power of the semiconductor switch during the switch-on process of the load due to adjusting of the control signal, a load current rises in a stepped-shaped increase or in a gradual or ramp-shaped increase.

6. The electronic circuit breaker according to claim 5, wherein the control unit is supplied with a voltage signal representing the drain voltage and representing the source voltage of the semiconductor switch.

7. The electronic circuit breaker according to claim 6, wherein the control unit at the input end is connected to a first voltmeter to detect the input voltage and/or the drain voltage of the semiconductor switch, and to a second voltmeter to detect a load voltage and/or a source voltage of the semiconductor switch, the first voltmeter being connected between the voltage input and the drain connection of the semiconductor switch and the second voltmeter being connected between the source connection of the semiconductor switch and the load output.

8. The electronic circuit breaker according to claim 6, wherein the control unit determines the drain-source voltage of the semiconductor switch from a difference of the detected drain or input voltage and the detected source or load voltage.

9. The electronic circuit breaker according to claim 5, wherein the control unit, depending on the detected load current, triggers the semiconductor switch such that in the event of overload and/or a short circuit, the load current is limited to a threshold value.

10. The electronic circuit breaker according to claim 5, wherein the semiconductor switch is a field-effect transistor or a MOSFET, a drain connection of which is associated with the voltage input and a source connection of which is associated with the load output.

* * * * *